United States Patent [19]
Colombo et al.

[11] Patent Number: 5,693,173
[45] Date of Patent: Dec. 2, 1997

[54] THERMAL GAS CRACKING SOURCE TECHNOLOGY

[75] Inventors: Paul E. Colombo, White Bear Lake; Scott W. Priddy, St. Louis Park, both of Minn.

[73] Assignee: Chorus Corporation, White Bear Lake, Minn.

[21] Appl. No.: 361,055

[22] Filed: Dec. 21, 1994

[51] Int. Cl.$^6$ .................................................. C23C 14/00
[52] U.S. Cl. ...................... 156/345; 118/723 HC; 118/724; 134/11; 134/105
[58] Field of Search ............. 156/345; 118/723 HC, 118/724; 134/1.1, 105

[56] References Cited

U.S. PATENT DOCUMENTS

| | | | |
|---|---|---|---|
| 3,989,549 | 11/1976 | Cangiano | 148/568 |
| 4,592,308 | 6/1986 | Shih et al. | 118/726 |

OTHER PUBLICATIONS

Kuroda et al., "Selective Growth of InGaAs/InP Layers By Gas Source MBE With Atomic Hydrogen Irradiation", NEC Corp., Opto–electronics Research Laboratories, 52–55.

Sugaya et al., "Low–Temperature Cleaning of GaAs Substrate by Atomic Hydrogen Irradiation", *Japanese Journal of Applied Physics*, vol. 30, No. 3A, Mar., 1991, L402–L404.

Shimomura et al., "Low Dislocation Density GaAs on Vicinal Si(100) Grown by Molecular Beam Epitaxy with Atomic Hydrogen Irradiation", *Japanese Journal of Applied Physics*, vol. 31, Part 2, No. 5B, May 15, 1992, L628–L631.

Kurado et al., "Selective Growth of InGaAs–InP Layers by Gas Source Molecular Beam Epitaxy with Atomic Hydrogen Irradiation", *Japanese Journal of Applies Physics*, vol. 32, Part 2, No. 11A, Nov. 1, 1993.

Chun et al., "Low Temperature Surface Cleaning of InP by Irradiation of Atomic Hydrogen", *Japanese Journal of Applied Physics*, vol. 32, Part 2, No. 2B, Feb., 1993, L287–L289.

Kao et al., "Effects of Atomic Hydrogen On Impurity Reduction in MOMBE–Grown GaAs", *Mal. Res. Soc. Symp. Proc.*, vol. 145, 1989 Materials Research Society, 57–61.

Okada et. al., "High–Quality GaAs Films on Si Substrates Grown by Atomic Hydrogen–Assisted Molecular Beam Epitaxy for Solar Cell Applications", *Japanese Journal of Applied Physics*, vol. 32, Part 2, No. !0B, Oct. 15, 1993, L1556–L1558.

*Primary Examiner*—Richard Bueker
*Attorney, Agent, or Firm*—Joel D. Skinner, Jr.

[57] ABSTRACT

An atomic hydrogen source. The source has an elongated cylindrical structure with proximal and distal or inner and outer ends. A head structure is disposed at the proximal end for communicative connection with electrical power, gas, temperature control and related systems. A mounting flange is disposed along the length of the source for connection with an MBE or other apparatus. A tube structure is disposed at the distal end for extension into the apparatus. The tube structure includes gas and power conduction elements, including a high temperature resistive filament for cracking gas.

15 Claims, 7 Drawing Sheets

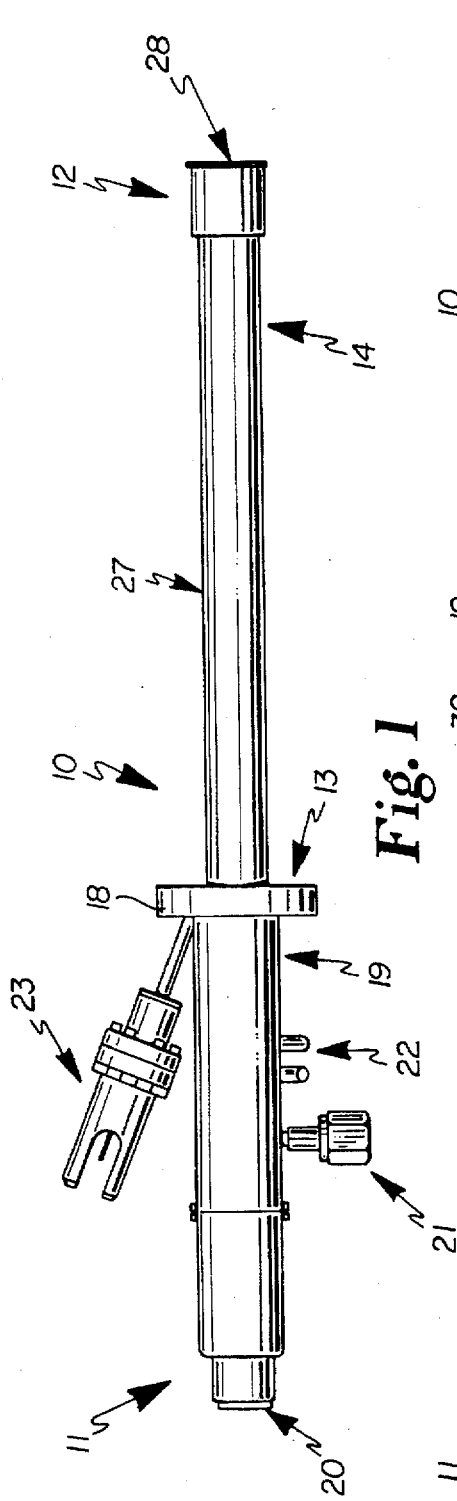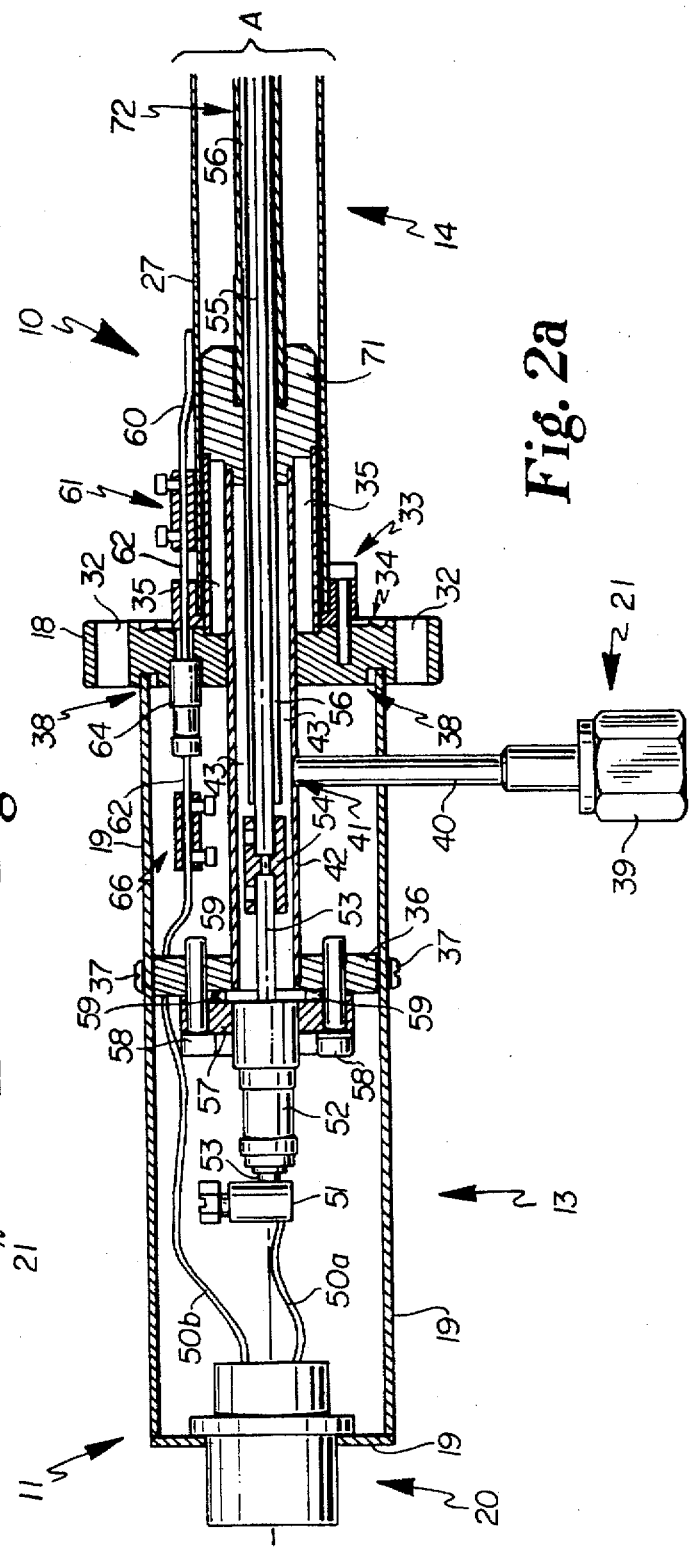
Fig. 1
Fig. 2a

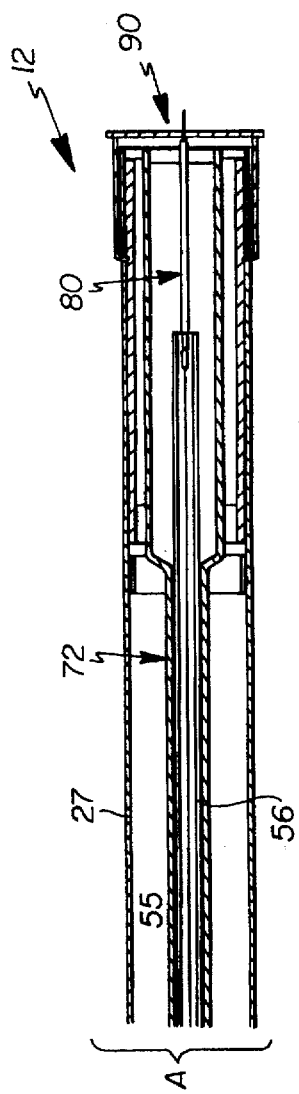
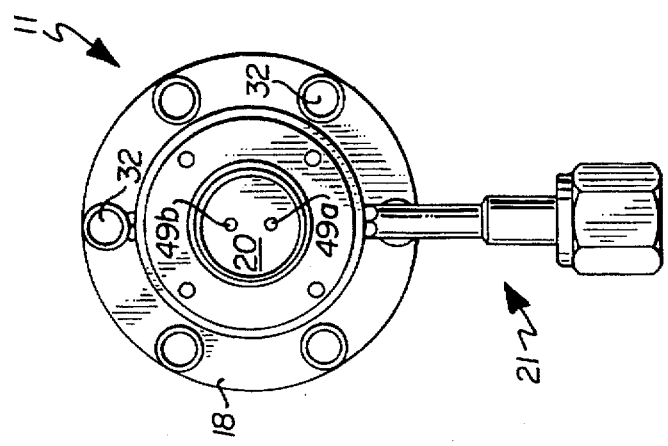
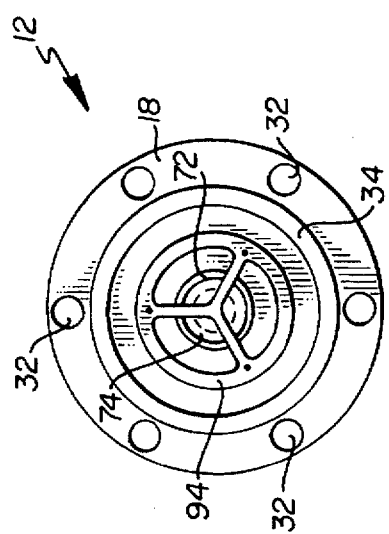
Fig. 2b
Fig. 3
Fig. 4

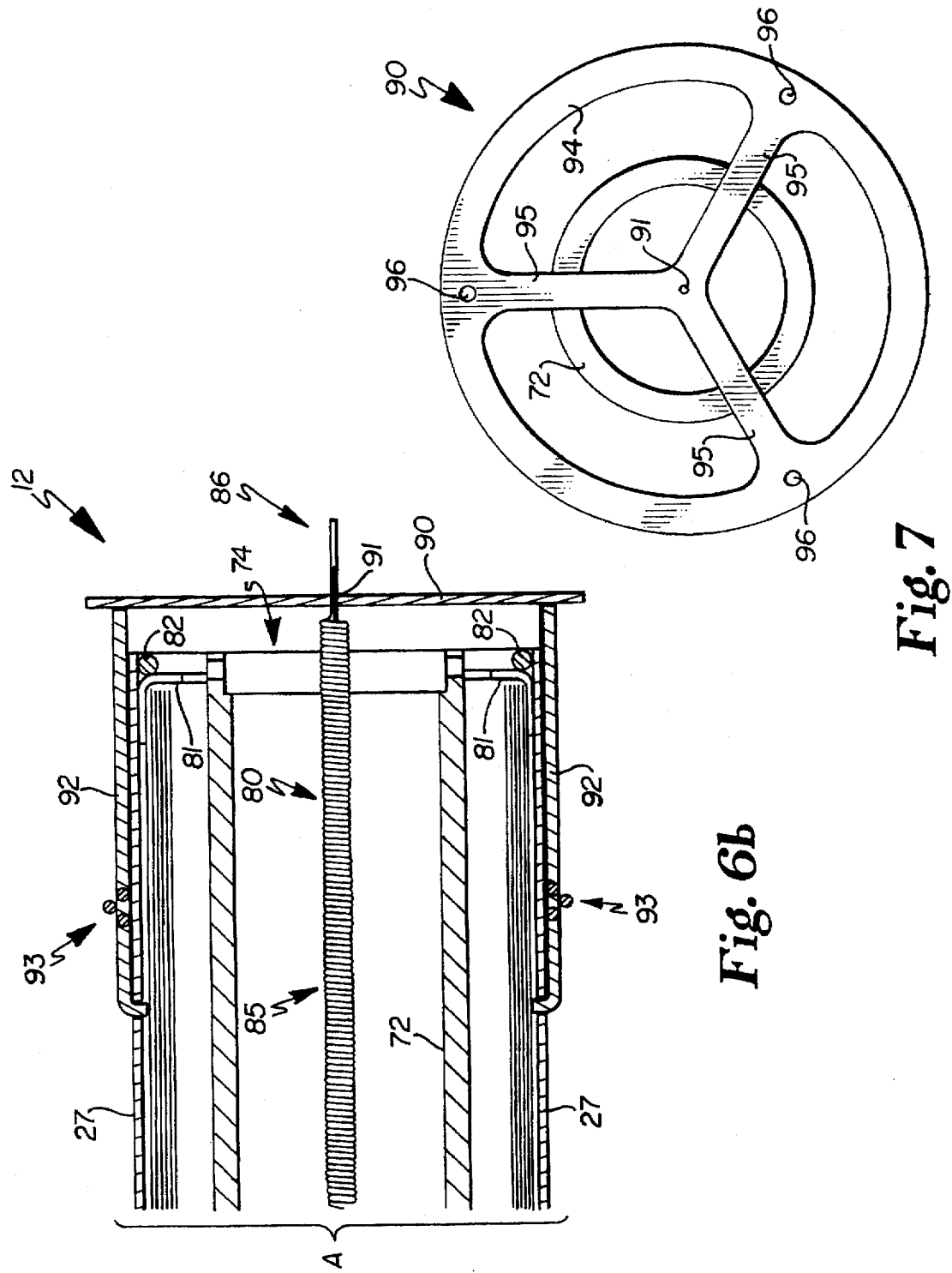

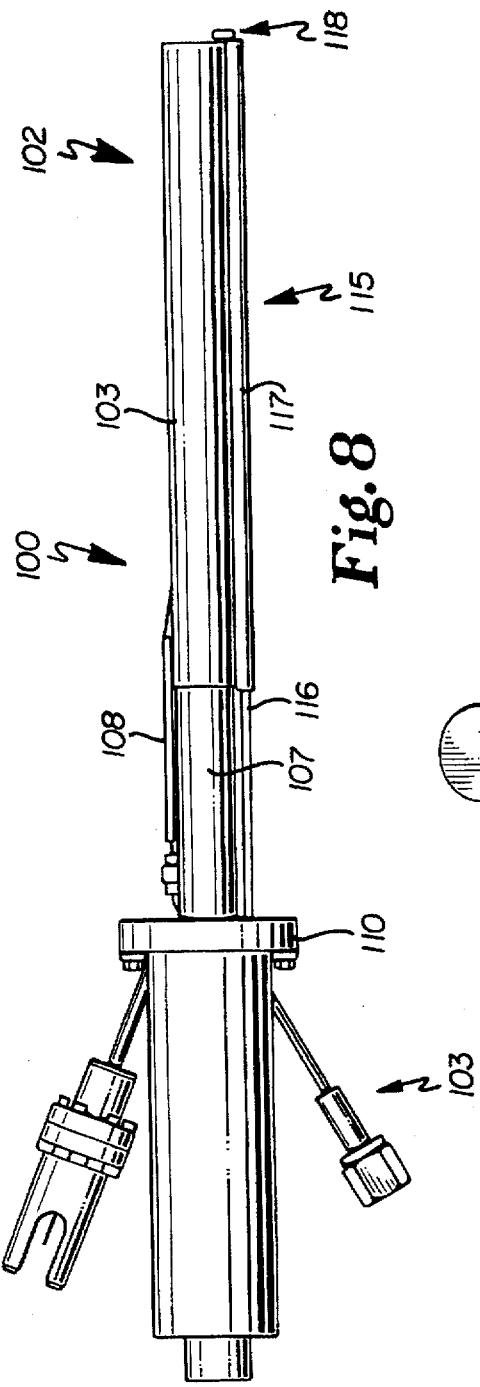
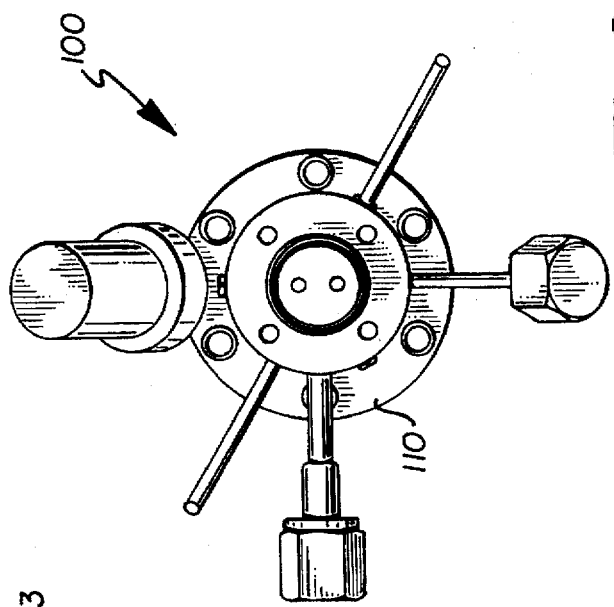
Fig. 8
Fig. 9

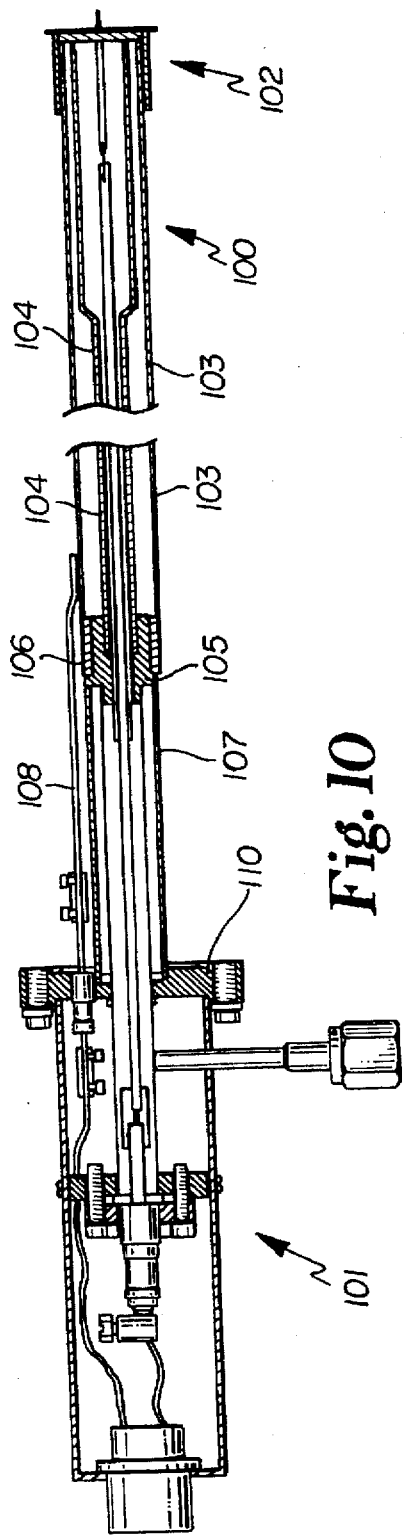
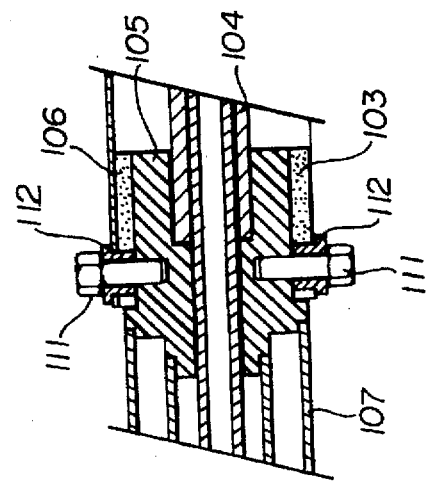
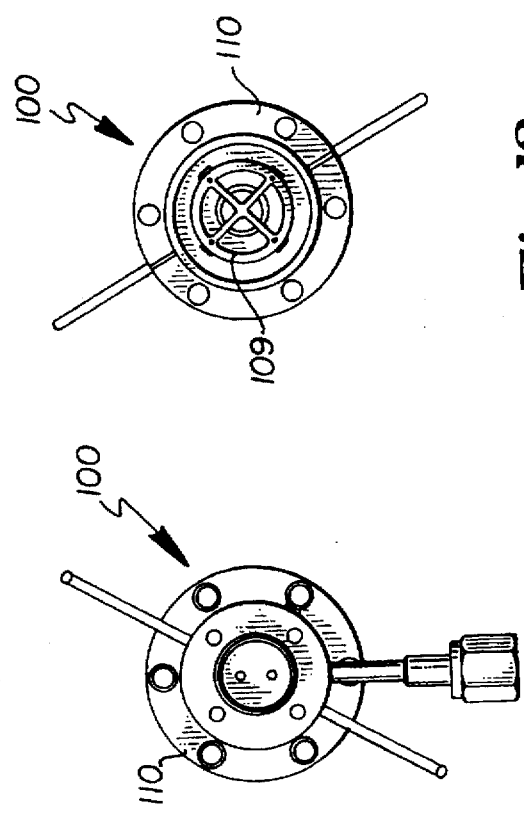
Fig. 10
Fig. 11
Fig. 12
Fig. 13

THERMAL GAS CRACKING SOURCE TECHNOLOGY

BACKGROUND OF THE INVENTION

1. Field of the Invention

This invention relates to apparatus and methods for the preparation of substrates and deposition processes used in the compound semiconductor and related industries. More particularly, the invention relates to molecular beam epitaxy (MBE) apparatus and methods. The apparatus and methods of this invention provide an improved thermal cracking effusion cell, also referred to as a source, for atomic hydrogen.

2. Background Information

Molecular beam epitaxy is a growth process which involves the deposition of thin films onto a heated crystalline substrate in a vacuum by directing molecular or atomic beams onto the substrate. Deposited atoms and molecules migrate to energetically preferred lattice positions on the substrate, which is heated, yielding film growth of high crystalline quality, and optimum film thickness uniformity. MBE is widely used in compound semiconductor research and in the semiconductor device fabrication industry, for thin-film deposition of elemental semiconductors, metals and insulating layers.

A principal apparatus utilized in MBE deposition is the thermal effusion cell or source, for uses with gases such as hydrogen, arsine and phosphine. The source thermally cracks undiluted high-purity gases into dimers or atomic species. Cracking is accomplished via a high temperature filament or other resistive heating element in the source. In practice, a plurality of cells are mounted, via ports, in a liquid nitrogen cooled growth chamber which has an ultra high vacuum, on the order of 1E-11 Torr. Each cell generates a beam which is directed at a predetermined angle toward a substrate, for example a gallium arsenide (GaAs) wafer, which is mounted on a downwardly oriented, heated, rotary substrate holder. Each cell deposits a selected element or molecule on the substrate. Control of the beam is typically accomplished via a shutter or vane. After various preparatory procedures are performed on the substrate, the sources are powered up, heated and unshuttered, whereby the desired epitaxial growth is accomplished on the heated, rotating substrate. After depositional growth, the wafer is cooled, inspected and processed for removal.

In the past, various devices and/or methods have been used and/or proposed for substrate preparation such as cleaning off oxides and epitaxial deposition as they relate to atomic hydrogen for use in MBE. However, these devices and methods have significant limitations and shortcomings. Specifically, prior art atomic hydrogen sources rely on ceramic and other filament support components which tend to be unacceptably reactive or which outgas undesired impurities at elevated temperatures.

Despite the need in the art for a thermal cracking atomic hydrogen source which overcomes the disadvantages, shortcomings and limitations of the prior art, none insofar as is known has been developed or proposed.

Accordingly, it is an object of the present invention to provide an improved thermal cracking atomic hydrogen source. It is a further object of this invention to provide a source which is does not rely on ceramic supporting structures and which operates at an optimal temperature. Finally, it is an object of the present invention to provide a source which overcomes, generally, the limitations and shortcomings of the prior art.

SUMMARY OF THE INVENTION

The apparatus of the present invention provides an effusion cell comprising:

(a) gas supply and transmission means;

(b) power supply and conduction means; and (c) a thermal cracking filament connected to the gas supply and transmission means and to the power supply and conduction means, the filament having a predetermined coiled length and being unsupported except at its ends.

In a preferred embodiment of the invention, the thermal cracking filament is formed by:

(i) winding wire into a predetermined configuration, (ii) cleaning the wire, (iii) subjecting the wire to a vacuum of less than $1 \times 10^{-8}$ Torr, (iv) passing current through the wire to heat it to greater than 1590 degrees Celsius for a period of time sufficient to recrystallize the wire in its predetermined position, and (v) removing the vacuum and cooling the wire.

The invention additionally provides a method of preparing an effusion cell filament comprising the steps of:

(a) winding wire into a predetermined configuration, (b) cleaning the wire, (c) subjecting the wire to a vacuum of less than $1 \times 10^{-8}$ Torr, (d) passing current through the wire to heat it to at least 1590 degrees Celsius for a time period sufficient to recrystallize the wire in its predetermined configuration, and (e) removing the vacuum and cooling the wire.

The invention finally provides an effusion cell comprising:

(a) a cell body comprising an inner tube with an interior cavity and a concentric, conductive outer tube having an interior cavity enclosing the inner tube;

(b) gas supply means connected to the inner tube interior cavity;

(c) a thermal cracking filament disposed in the interior cavity of the inner tube and being communicatively connected to the outer tube; and (d) power supply means connected to the filament and to the outer tube, whereby the outer tube forms part of the power conduction path.

The features, benefits and objects of this invention will become clear to those skilled in the art by reference to the following description, claims and drawings.

BRIEF DESCRIPTION OF THE DRAWINGS

FIG. 1 is a front view of the gas cracking source of the present invention.

FIG. 2 is a crossectional view of the apparatus taken vertically along the central axis of the apparatus shown in FIG. 1.

FIG. 3 is an end view of the apparatus taken from the left side of FIG. 2.

FIG. 4 is an end view of the apparatus taken from the right side of FIG. 2.

FIG. 7 is an end view of the portion of the apparatus taken from the right side of FIG. 6.

FIG. 8 is a front view of an alternative embodiment of the source.

FIG. 9 is an end view of the source taken from the right side of FIG. 8.

FIG. 10 is a crossectional view of the source.

FIG. 11 is an end view of the source taken from the right side of FIG. 10.

FIG. 12 is an end view of the source taken from the left side of FIG. 10.

FIG. 13 is a detailed view of the weld adapter shown in FIG. 12.

DESCRIPTION OF THE PREFERRED EMBODIMENTS

Figure 5:
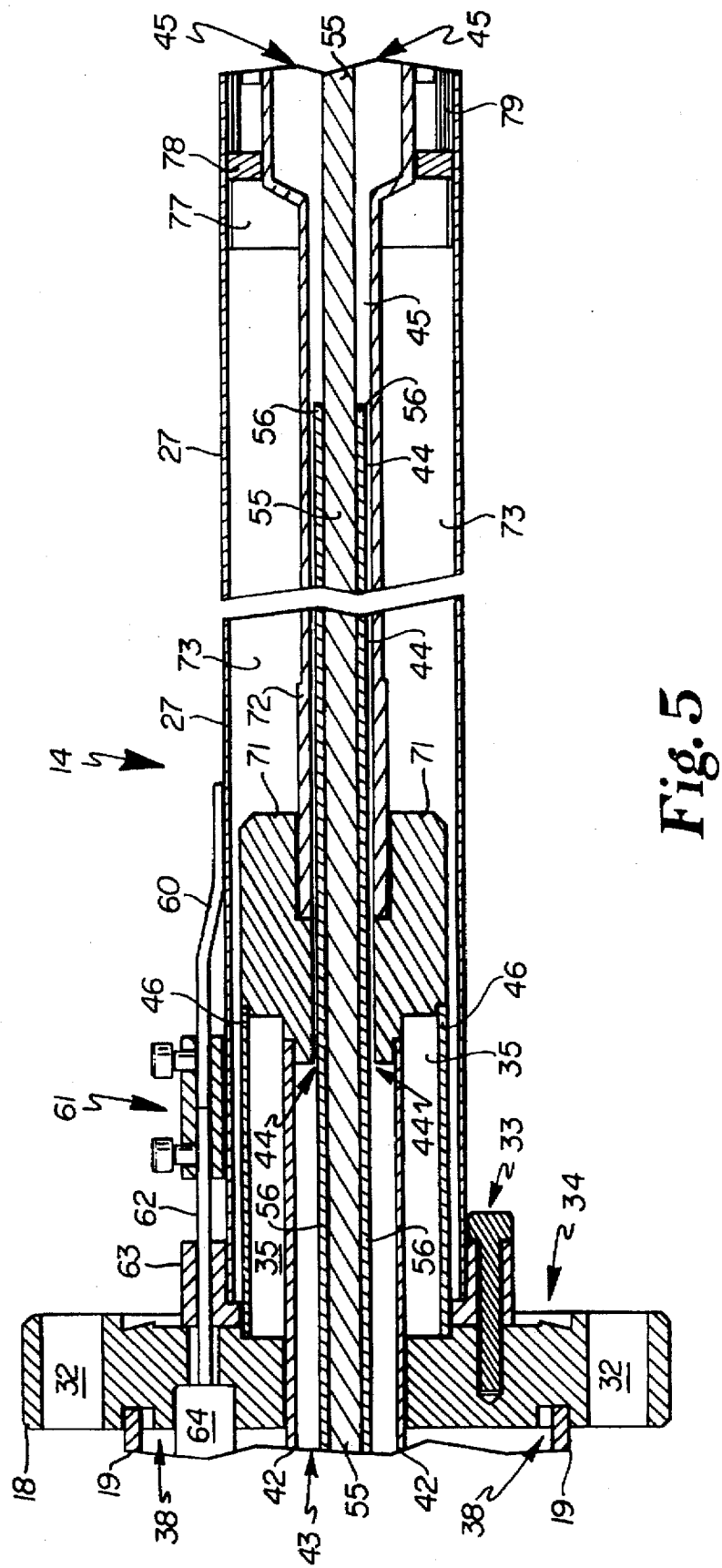
FIG. 5 is a detailed crossectional view of the midportion of the apparatus.

The gas cracker apparatus of the present invention is shown and described herein, in an atomic hydrogen source which generates atomic hydrogen. The source is a useful tool for low temperature, in-situ cleaning of GaAs, InP and other substrates. The generated hydrogen atoms react with carbon and oxides on the substrate surface, creating more volatile species that desorb at low temperatures. Atomic hydrogen irradiation is also used for Si substrate preparation, to lower dislocation densities, and during growth of GaAs on Si to modify the surface energy of the GaAs growth front and thereby promote two-dimensional growth. Finally the hydrogen source is useful for selective epitaxial growth in MBE and GSMBE. Although the particular embodiment shown is an atomic hydrogen source, the teachings of this invention are applicable to thermal crackers in general.

The source design shown and described is compatible with all MBE source ports. The length may be varied consistent with the teachings of the invention. Additional modifications that may be made include, but are not limited to, addition of a linear motion bellows for use in a growth chamber port other than an effusion cell port, addition of a thermocouple for closed loop temperature control, and/or addition of an injector for use with gasses such as $CBr_4$ in C-doping.

Referring to FIG. 1, the source 10 has an elongated cylindrical structure with proximal and distal or inner and outer ends 11 and 12 as is common in the art. A head structure 13 is disposed at the proximal end 11 for communicative connection with electrical power, gas, temperature control and related systems. A source mounting flange 18 is generally centrally disposed along the length of the source 10 for connection with an MBE or other apparatus. A tube structure 14 is disposed at the distal end 12 for extension into the apparatus.

Referring to FIGS. 2-4, the source 10 has numerous internally disposed components. The head structure 13 inclues a cylindrical housing or shroud 19 which defines an internal cavity. A connector 20 is disposed at the proximal end of the housing 19 for connection to an electrical power source (not shown). Gas inlet 21, cooling inlets 22 and a thermocouple connector are coupled to the housing 19. The head 13 unites with the flange 18 at an annular groove 38 disposed on the proximal side of the flange 18. The tube structure 14 comprises an elongated, cylindrical, relatively thin walled outer or power return tube 27 which is preferably constructed of tantalum. The tube 27 is connected to the distal side of the flange 18, as described in detail below, and also has a hollow interior. The stainless steel flange 18 has a plurality of apertures 32, through which connection bolts (not shown) extend to couple the source 10 to a growth chamber, for example. An isolator mounting screw 33 is connected to the distal side of the flange 18. The distal side of the flange also has a metal sealed knife edge flange 34, preferably a Conflat Flange 34 for connection with the growth chamber (not shown).

A power inlet flange 36 is generally centrally and transversely disposed across the interior of the housing 19 and fixed in position via a plurality of screws 37. Tension provided by the screws 37 also functions to secure the shroud 19 in channel 38. A second flange 57 of a smaller diameter than that of the first flange 36 is connected to the first flange 36 via screws 58. Both flanges 36 and 58 have a central aperture for extension of other components therethrough. A copper metal sealed knife edge flange 59 is interposed between the flanges 36 and 57, around the central apertures. In an operative orientation, this structure seals components which are disposed distally with respect to it, in a vacuum environment. A gas inlet tube 42 is disposed concentrically with respect to and extends from vacuum flange 36 to mounting flange 18. The tube 42 is preferably constructed of stainless steel and is welded to the distal side of the flange 18 at an annular channel thereon. The tube 42 extends through the flange 18, distally, a predetermined distance and is connected to a cylindrical stainless steel weld adapter 71 disposed in tube 27. Inlet tubing 40 is coupled to the inlet tube 42 at inlet aperture 41. An inlet tubing 40 receives input gas from an external gas manifold (not shown) and is connected to the manifold via a ¼ inch VCR® fitting 39. Referring also to FIG. 5, gas, in this embodiment $H_2$, enters the void or cavity 43 of the tube 42 and flows to a low volume gas feed through cavity 44, formed between weld adapter 71 and layer 56, and to a cylindrical outlet cavity 45, of substantially increased volume, disposed at the distal end of the source 10. A pressure gradient is formed through the length of the cavities 44 and 45, wherein gas pressure decreases distally so as to maintain positive flow of $H_2$ and/or other gases toward the distal end 12 of the source 10 at all times. Outlet cavity 45 terminates in gas egress aperture 74 at the distal end of the source 10. Gas is thermally cracked as it enters the region 45 surrounding the heated filament 80. Atomic hydrogen is emitted from the egress aperture 74.

An outer stainless steel tube 46 defines cavity 35 for flow of coolant. This coolant cavity 35 maintains a relatively low temperature on the order of 60 degrees Celsius proximate the head 13, even as heat is conducted proximally along tube 27. A void 73 is formed between cracking tube 72 and power return tube 27.

Referring again to FIGS. 2 and 5, a number of electrical components are disposed in the head 13. A pair of wires 50a and b extend from male crimp-type sockets 49a and b of the connector 20. Lead 50a is joined to a nickel power conduction rod 53 via clamp connector 51. The power conduction rod 53 is surrounded by a power feed through 52 and passes through flanges 57 and 36 and gasket 59. The power feed through 52 maintains the vacuum seal in cooperation with the flanges 57 and 36 and gasket 59. The nickel rod 53 is connected to an elongated tungsten power conduction rod 55 via barrel connector 54. The power conduction rod 55 is concentrically disposed with respect to the gas inlet tube 42 and a cracking tube 72 and extends to the distal end of the tube 72. One end of a filament 80 is connected to the end of the rod 55. The opposite end of the filament 80 is connected to a filament support disk 90. The filament support disk 90 in turn is communicatively connected to the outer or power return tube 27. The power return tube 27 is connected to a first return conductor 60 which is preferably a tantalum wire welded to the tube 27. The first return conductor 60 is connected to a second return conductor 62, preferably moly wire, via a barrel connector 61. The second conductor 62 passes through ceramic isolator 63, preferably a high temperature aluminum oxide structure, and the flange 18. A power feed through 64 seals the flange 18. Second conductor 62 is connected to lead 50b via a barrel connector 66. The lead 50b is connected to socket 49b of connector 20. The aforementioned elements create an electrical conduction path whereby current is transmitted from the connector 20 to the resistive filament 80 for heating purposes, and returned to the connector to complete a circuit. Importantly, the structural outer tube 27 is utilized in the current return path.

The cracking tube 72 is preferably constructed of tungsten. The cracking tube 72 is sheathed by a thin ceramic insulation layer 56 through a predetermined length. The gap or space between insulation layer 56 and the cracking tube 72 defines gas passage 44. The proximal end of cracking tube 72 is brazed to stainless steel weld adapter 71. Adapter 71 is preferably tungsten inert gas (TIG) welded to flange 18. The distal end of the cracking tube 72 is supported in the tube 27 by an isolator 78. The isolator 78 is held in place by a retainer 77. Heat shielding 79, of a type capable of withstanding distal end temperatures of approximately 1200–1500 degrees Celsius, is disposed between the cracking tube 72 and the power return tube 27 in the region of the filament 80. The heat shielding 79 is held in place by a retainer 81 which is secured by a retainer wire 82.

Figure 6A:
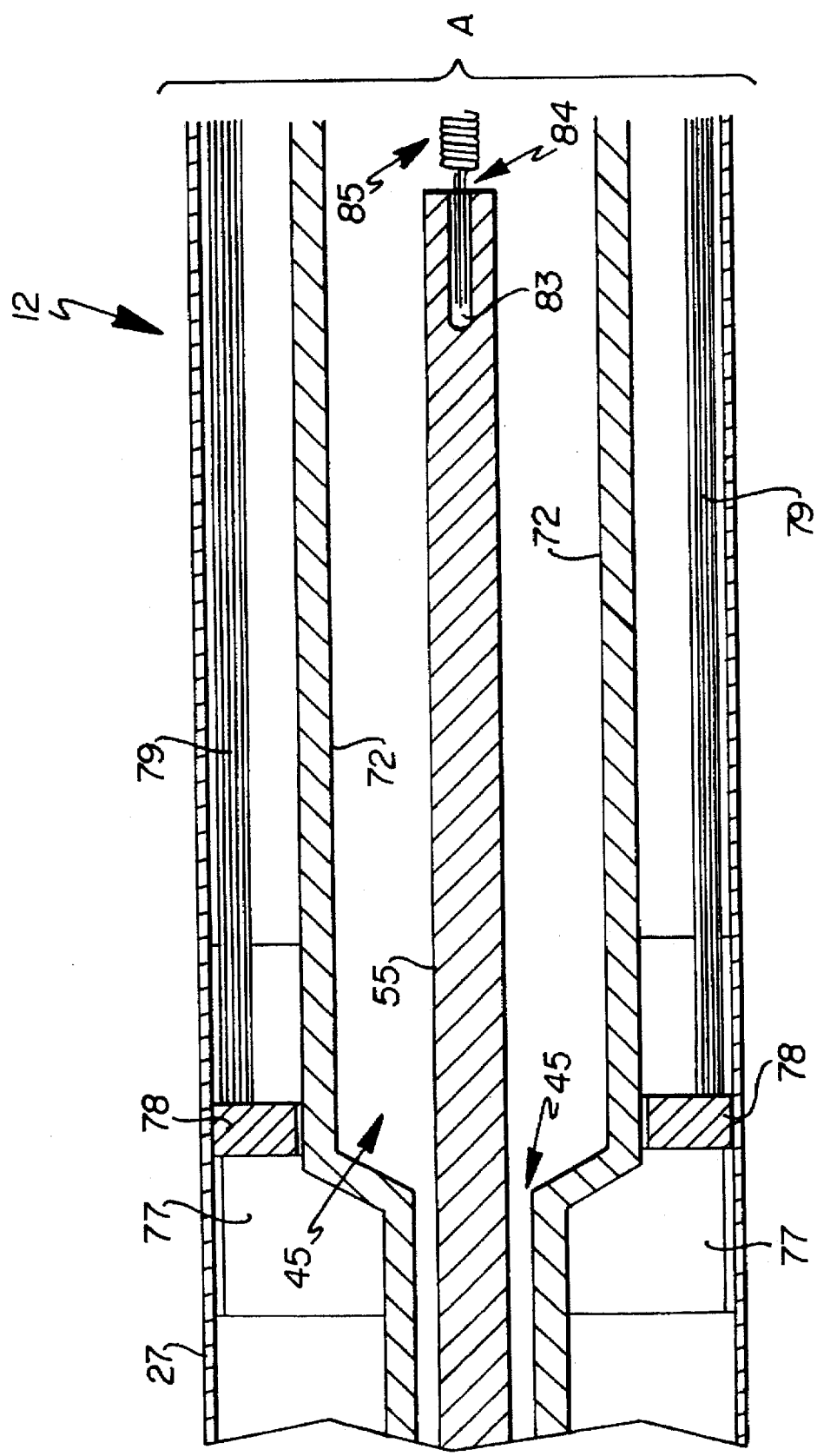
FIG. 6 is a detailed crossectional view of the distal end portion of the apparatus.

Referring to FIGS. 4, 6 and 7, the filament 80 is a rigid structure which includes a straight proximal end 84, a coiled middle 85 of a predetermined length and a straight distal end 86. The filament is constructed of Tungsten wire. The proximal end 84 is connected to an aperture 83 on power conductor rod 55. The distal end 86 is connected to an aperture 91 in support member 90. Importantly, these ends 84 and 86 are the sole support points and the middle section 85 is unsupported by any external means.

The filament 80 material is processed to hold its shape while being supported only at its ends, at very high cracking temperatures. The method of pretreating the filament 80 for use in the source 10 involves the following steps. First, 0.010–0.020 inch diameter Tungsten wire is wound into a filament configuration as shown utilizing a winding fixture. Second, the filament 80 is cleaned in a soap and water solution, rinsed in alcohol and dried in an air oven at a predetermined temperature. Third, the filament 80 is mounted to a fixture to hold its shape. Fourth, the fixture is attached to a vacuum chamber that has a pressure of less than $1\times10^{-8}$ Torr. The filament 80 is oriented vertically so it does not deform under its own weight during the next step, which is a recrystallization. In a fifth step, current is passed through the filament 80, heating it to a sufficient temperature and for a sufficient period of time to permit recrystallization of the filament 80 in its predetermined configuration. Preferably, the filament 80 is heated to 2200 degrees Celsius (C.) for one minute. A minimum temperature for heating is 1590 degrees C. Sixth, the filament 80 is cooled and removed from the vacuum chamber. Finally, the filament 80 is trimmed to a predetermined length.

The filament support member 90 is a disk shaped structure with an annular ring portion 94 and a plurality, preferably four, of radial arm members 95 extending from the ring portion 94 and joining at aperture 91. A plurality of mounting legs 92, longitudinally oriented and disposed about the exterior surface of the return tube 27 distal end, are connected to the ring portion 94 via TIG welding through apertures 96. The legs 92 are secured to the return tube 27 via locking wire 93. The support member 90 and legs 92 form part of the current return path described above.

FIGS. 8–13 show an alternative embodiment of the source 100. The proximal and distal ends of the source 100 are substantially similar, structurally and functionally, to the source 10 embodiment described above. The source 100 has an outer tube 103 enclosing a cracking tube 104. A stainless steel weld adapter 105 is disposed between the outer tube 103 and a medial tube 107. An isolator 106 is disposed between the outer tube 103 and the weld adapter 105. Mounting screws 111 connect the outer tube 103 to the weld adapter 105. Shoulder ceramics 112 isolate the mounting screws 111 from the outer tube 103. The medial tube 107 is connected to the source flange 110. Return wire 108 extends from the source flange 110, over the medial tube 107, and is connected to the outer tube 103.

The support disk ring 109 has four (4) radial arms or ribs.

An auxiliary gas injector 115 is shown in FIG. 8. The injector 115 includes a gas inlet line 116, a ceramic isolation tube 117 surrounding the inlet line 116, and a gas diffuser 118. The injector 115 is for use with gasses such as $CBr_4$ in C-doping and the like.

As many changes are possible to the embodiments of this invention utilizing the teachings thereof; the descriptions above, and the accompanying drawings should be interpreted in the illustrative and not the limited sense.

The invention claimed is:

1. An effusion cell comprising:
   (a) a cell body comprising an inner tube with an interior cavity and an outer tube having an interior cavity enclosing said inner tube;
   (b) gas supply means connected to said inner tube cavity;
   (c) a thermal cracking filament disposed in said cavity of said inner tube and being communicatively connected to said outer tube; and
   (d) electrical power supply means connected to said filament and to said outer tube.

2. The effusion cell of claim 1, wherein said inner tube and said outer tube have elongated cylindrical configurations with proximal and distal ends, said inner and outer tubes being concentrically disposed and joined proximate their proximal ends by a weld adapter and joined proximate their distal ends by an isolator.

3. The effusion cell of claim 2, further comprising a power conduction rod, said power conduction rod having an elongated configuration with proximal and distal ends and being concentrically disposed in said inner tube cavity, said power conduction rod being connected to said power supply means at its said proximal end and connected to said filament at its said distal end.

4. The effusion cell of claim 3, wherein said power conduction rod is constructed of tungsten and further comprising a layer of ceramic insulator surrounding said power conduction rod.

5. The effusion cell of claim 1, wherein said gas supply means is communicatively connected to said inner tube interior cavity.

6. The effusion cell of claim 5, wherein said inner tube interior cavity has a small diameter in a first, proximally oriented, region, and a large diameter in a second, distally oriented, region, to maintain positive gas flow distally.

7. The effusion cell of claim 3, wherein said filament has a proximal end and a distal end, and wherein said proximal end of said filament is connected to said distal end of said power conduction rod, and wherein said effusion cell further comprises means to support said distal end of said filament and conductively connect said filament to said outer tube.

8. The effusion cell of claim 7, wherein said means to support and conductively connect comprises a flat disk connected to said outer tube, and having a central aperture for connection of said filament distal end and a plurality of gas egress apertures.

9. The effusion cell of claim 1, wherein said filament has a predetermined coiled length and is unsupported except at its ends.

10. The effusion cell of claim 1, wherein said filament is constructed of tungsten wire treated and formed by:
   (i) winding wire into a predetermined configuration,
   (ii) cleaning said wire,
   (iii) subjecting said wire to a vacuum,
   (iv) passing current through the wire for a predetermined period of time sufficient to recrystallize said wire in said predetermined configuration, and
   (v) removing the vacuum and cooling the wire.

11. The effusion cell of claim 10 wherein said vacuum is less than $1\times10^{-8}$ Torr.

12. The effusion cell of claim 10, wherein said current is passed to heat said wire to at least 1590 degrees Celsius.

13. The effusion cell of claim 12, wherein said current is passed to heat said wire to 2200 degrees Celsius for one minute.

14. The effusion cell of claim 1, wherein said cell is an atomic hydrogen source.

15. An effusion cell comprising:
   (a) a cell body comprising an inner tube with an interior cavity and an outer support structure surrounding at least a portion of said inner tube;
   (b) gas supply means connected to said inner tube cavity;
   (c) a thermal cracking filament disposed in said cavity of said inner tube, said thermal cracking filament being electrically connected to said outer support structure; and
   (d) electrical power supply means connected to said thermal cracking filament and to said outer support structure.

* * * * *